(12) United States Patent
Paschen et al.

(10) Patent No.: US 12,317,607 B2
(45) Date of Patent: May 27, 2025

(54) PROCESS FOR MANUFACTURING A SOLAR CELL STRING, SOLAR CELL STRING, PROCESSING DEVICE FOR A SOLAR CELL STRING, AND USE OF SUCH A PROCESSING DEVICE FOR MANUFACTURING A SOLAR CELL STRING

(71) Applicant: FRAUNHOFER-GESELLSCHAFT ZUR FÖRDERUNG DER ANGEWANDTEN FORSCHUNG E. V., Munich (DE)

(72) Inventors: Jan Tobias Paschen, Freiburg (DE); Jan Nekarda, Freiburg (DE); Andreas Brand, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/282,558

(22) PCT Filed: Mar. 17, 2022

(86) PCT No.: PCT/EP2022/056943
§ 371 (c)(1),
(2) Date: Sep. 18, 2023

(87) PCT Pub. No.: WO2022/194993
PCT Pub. Date: Sep. 22, 2022

(65) Prior Publication Data
US 2024/0178332 A1    May 30, 2024

(30) Foreign Application Priority Data
Mar. 18, 2021    (DE) ..................... 10 2021 106 598.4

(51) Int. Cl.
*H10F 19/90*    (2025.01)
*H10F 19/40*    (2025.01)
*H10F 71/00*    (2025.01)

(52) U.S. Cl.
CPC ........... *H10F 19/904* (2025.01); *H10F 19/40* (2025.01); *H10F 71/1375* (2025.01)

(58) Field of Classification Search
CPC .... H10F 19/904; H10F 19/40; H10F 71/1375; H10F 19/00; H10F 19/902; Y02E 10/50
See application file for complete search history.

(56) References Cited

U.S. PATENT DOCUMENTS

2014/0124014 A1    5/2014    Morad et al.
2018/0212073 A1    7/2018    Zhang et al.
(Continued)

FOREIGN PATENT DOCUMENTS

JP    H0567017 U    9/1993

*Primary Examiner* — Angelo Trivisonno
(74) *Attorney, Agent, or Firm* — Volpe Koenig (57) ABSTRACT

A method for producing a solar cell string includes:
providing a solar cell stack having at least five solar cells which each have a front side and a rear side, the solar cells are arranged in overlapping fashion; and
forming electrically conductive connections between the solar cells by:
arranging an electrically conductive first connecting element on the solar cell stack and forming electrically conductive connections;
dividing the first connecting element into a first group of cell connectors;
arranging an electrically conductive second connecting element on the solar cell stack and forming electrically conductive connections; and
dividing the second connecting element into a second group of cell connectors.

12 Claims, 4 Drawing Sheets

(56) References Cited

U.S. PATENT DOCUMENTS

2018/0367095 A1   12/2018  Morad et al.
2019/0312163 A1*  10/2019  Lu .......................... H10F 19/20
2021/0005773 A1    1/2021  Nekarda et al.

* cited by examiner

PROCESS FOR MANUFACTURING A SOLAR CELL STRING, SOLAR CELL STRING, PROCESSING DEVICE FOR A SOLAR CELL STRING, AND USE OF SUCH A PROCESSING DEVICE FOR MANUFACTURING A SOLAR CELL STRING

FIELD OF THE INVENTION

The invention relates to a method for producing a solar cell string, to a solar cell string, to a processing device for a solar cell string, and to the use of a processing device for producing a solar cell string.

BACKGROUND

The use of photovoltaic solar cells for converting electromagnetic radiation into electrical energy is typically implemented by means of a solar cell module, which comprises a plurality of solar cells.

Such solar cell modules typically have a plurality of solar cell strings. A solar cell string comprises multiple solar cells which are electrically conductively connected to one another. Typically, the solar cells in a solar cell string are connected in series, since an individual solar cell generates a rather low voltage, but a high current.

Typical solar cells have two metallic contacting structures, what are referred to as electrodes. A p-type electrode is electrically conductively connected to a p-doped region of the solar cell and an n-type electrode is electrically conductively connected to an n-doped region of the solar cell.

The series connection of solar cells in a solar cell string is typically implemented by means of a rigid cell connector, which electrically conductively connects the metallic contacting structure of a solar cell to a metallic contacting structure of an adjacent solar cell. Typically, the electrically conductive connection is implemented so as to form a series connection, such that the n-type electrode of the one solar cell is electrically conductively connected to the p-type electrode of the adjacent solar cell, or vice versa.

Such a cell connector, however, has disadvantages in terms of handling during the production of the solar cell string. Moreover, mechanical stresses caused by mechanical loading of the solar cell string, in particular owing to thermal loading, can lead to an increase in the contact resistance between the cell connector and the solar cell through to interruption of the contact if the cell connector is detached. Furthermore, these rigid cell connectors exert thermomechanical stress on the cells, which can lead to breakage of the cells.

There is therefore a need for a solar cell string which is cost-effective to produce and nevertheless robust, and a method for producing it. In addition, typical cell connectors require a minimum distance between the adjacent solar cells owing to the thickness of the cell connector and the limit of the bending radii. There is a need to reduce this minimum distance.

SUMMARY

The present invention is therefore based on the object of providing such a method for producing a solar cell string and such a solar cell string.

This object is achieved by a method for producing a solar cell string, a solar cell string, a processing device for a solar cell string, and the use of such a processing device for carrying out the method as set forth in the appended claims.

Advantageous configurations are also found in the appended claims.

The method according to the invention for producing a solar cell string comprises method steps A and B:

In a method step A, a solar cell stack is provided having at least 5 solar cells, which each have a front side and a rear side, wherein the solar cells are arranged in overlapping fashion, such that for each solar cell a marginal contacting region on the front side of the solar cell and a marginal contacting region on the rear side of the solar cell are not covered by an adjacent solar cell, In method step B, electrically conductive connections are formed between the solar cells by:

a. arranging an electrically conductive first connecting element on the solar cell stack and forming electrically conductive connections, such that the first connecting element is electrically conductively connected on a first side of the solar cell stack to the contacting regions of the solar cells on the first side;

b. dividing the first connecting element into a first group of cell connectors, such that pairs of adjacent solar cells are electrically conductively connected to one another on the first side of the solar cell stack by the cell connectors of the first group;

c. arranging an electrically conductive second connecting element on the solar cell stack and forming electrically conductive connections, such that the second connecting element is electrically conductively connected on a second side of the solar cell stack to the contacting regions of the solar cells on the second side;

d. dividing the second connecting element into a second group of cell connectors, such that pairs of adjacent solar cells are electrically conductively connected to one another on the second side of the solar cell stack by the cell connectors of the second group.

The method according to the invention enables particularly cost-effective formation of a solar cell string, since only two connecting elements are placed onto the solar cell stack and are separated into cell connectors, each of which electrically conductively connects two solar cells that are adjacent in the later solar cell string to one another, only after electrical connection to the solar cells.

Advantageously, the electrical connection of the solar cells in the solar cell string is carried out in a manner known per se, wherein in the solar cell string the front side of a solar cell is electrically conductively connected to the rear side of an adjacent solar cell. As described above, typical solar cells have a respective metallic electrode on the front side and on the rear side. Advantageously, the cell connectors electrically conductively interconnect each metallic electrode on the front side of a solar cell to the metallic electrode on the rear side of the adjacent solar cell, or vice versa.

In order to form a connection between the front and the rear side of two adjacent solar cells, it is advantageous if, in method step A, the solar cells are arranged in the stack with mutually facing front sides or with mutually facing rear sides, in particular with alternating mutually facing front sides and mutually facing rear sides.

In this advantageous embodiment, therefore, starting from a lowermost solar cell in the solar cell stack in ascending order, the solar cells are arranged with mutually facing front sides and mutually facing rear sides in an alternating sequence or vice versa, starting with mutually facing rear sides, then with mutually facing front sides and continuing in an alternating sequence.

This ensures that a cell connector, which electrically conductively connects two solar cells lying one on top of the other to one another on one side of the solar cell stack, always electrically conductively connects a front side of a solar cell to a rear side of a solar cell.

It is within the scope of the invention for the first connecting element to be arranged on the first side of the solar cell stack and the second connecting element to be arranged on the second side of the solar cell stack, and then for both connecting elements to be divided into the first and the second group of cell connectors.

It is advantageous to divide the first connecting element in order to form the first group of cell connectors before arranging the second connecting element. This affords the advantage that the processing on the first side of the solar cell stack can be finished before processing takes place on the second side of the solar cell stack.

Advantageously, in method step B, the solar cell stack is turned over between arranging the first connecting element and arranging the second connecting element. This affords the advantage that the processing can take place from a consistent spatial direction. In this respect, it is advantageous in particular first of all, as described above, both to arrange and divide the first connecting element, then to turn over the solar cell stack and then to arrange and divide the second connecting element on the second side of the solar cell stack.

In an advantageous configuration, in method step B, in addition to the dividing of the first and the second connecting element, excess material of the first and the second connecting element is removed. In particular, it is advantageous to sever the excess material by means of laser radiation.

After method step B is finished, a solar cell stack having solar cells is formed, wherein, by virtue of the first and the second group of cell connectors, two respective solar cells lying one on top of another are electrically conductively connected to one another by a cell connector.

Advantageously, after method step B, a solar cell string arrangement having solar cells lying next to one another or having solar cells in a shingle arrangement is formed from the stack arrangement by rotational movements of the solar cells.

A further advantage of the method according to the invention consists in the method being suitable both for forming a solar cell string in the case of which the solar cells are arranged in a row next to one another in a plane, and for forming a shingle arrangement. A shingle arrangement of solar cells is known per se; the solar cells are arranged in overlapping fashion in the manner of roof shingles, such that each solar cell slightly covers an adjacent solar cell on one side and is slightly covered by another adjacent solar cell on another side.

It is within the scope of the invention if, in method step B, the electrically conductive connection of the first and the second connecting element to the solar cells is formed in a manner known per se, in particular preferably by the action of heat. It is within the scope of the invention if the electrically conductive connection is carried out by means of soldering and in particular by direct contact with a heated soldering element. It is also within the scope of the invention to form the electrically conductive connection by means of adhesive bonding, in particular by means of a conductive adhesive.

It is particularly advantageous if, in method step B, the electrically conductive connections of the first and the second connecting element to the solar cells are formed by means of laser radiation. It is known per se to use laser radiation to generate an action of heat for forming an electrically conductive connection between two metallic surfaces. In this advantageous embodiment, it is therefore possible to use detailed-definition units which are known per se, in particular detailed-definition units having lasers and laser deflection units.

It is therefore advantageous in particular if, in method step B, the first and the second connecting element are divided and the first and the second connecting element are electrically conductively connected to the solar cells by means of laser radiation. This enables cost-effective and rapid processing of the two method steps.

In order to be able to electrically conductively connect the solar cell string to further connecting elements, in particular to further solar cell strings, in a solar cell module, it is advantageous if, in method step A, a respective end connector is arranged and electrically conductively connected to the external solar cell on the external sides of the two terminal solar cells of the solar cell stack. Each of the two external solar cells is therefore electrically conductively connected to an end connector.

If the solar cell stack has an odd number of solar cells, it is preferably the case, in method step B, that one of the end connectors is electrically conductively connected to the first connecting element and the other end connector is electrically conductively connected to the second connecting element.

If the solar cell stack has an even number of solar cells, both end connectors are preferably electrically conductively connected to the same connecting element, in particular preferably to the first connecting element.

The result of this is the obtention, in method steps A and B, not only of an electrical connection between the solar cells of the solar cell string, but also an electrical connection of the first solar cell of the solar cell string to one of the end connectors and an electrical connection of the last solar cell of the solar cell string to the other end connector, in a manner which is economical in terms of the process.

The end connectors are preferably in the form of metallic elements, in particular preferably metallic elongate elements, which preferably have a length corresponding to the edge length of the solar cells transversely to the longitudinal extent of the solar cell string.

The first and the second connecting element are preferably in the form of pliant connecting elements. As a result, the mechanical loading on the contact surfaces between the cell connectors and the solar cells is reduced and a smaller distance between the solar cells in the solar cell string in comparison with rigid cell connectors is possible.

The thickness of the first and the second connecting element and therefore also of the cell connectors is preferably less than 100 μm, in particular preferably less than 50 μm, further preferably less than 20 μm. The thickness is preferably in the range from 5 μm to 30 μm.

It is within the scope of the invention for the connecting elements to be in the form of coated connecting elements, in particular metal-coated connecting elements, preferably metal-coated foils.

A particularly advantageous configuration is afforded in that the first and the second connecting element are in the form of a metal foil, preferably a single-layer metal foil. As a result, a cost-effective element which can be produced cost-effectively in comparison with coated or multi-layer foils is used as cell connector.

As described above, typical solar cells have an electrically conductive electrode on the front side and on the rear side at least in the contacting region. Advantageously, in method step A, solar cells are therefore provided that have an electrically conductive electrode on the front side and on the rear side at least in the contacting region and, in method step B, the first and the second connecting element are electrically conductively connected to the electrodes of the solar cells.

As set out in the introduction, an electrical series connection of solar cells in a solar cell string is advantageous. Advantageously, therefore, in method step B, the solar cells are electrically connected in series by means of the first and the second group of cell connectors.

The method according to the invention furthermore has the advantage that the cell connector at least on the front side of the solar cells only slightly covers the solar cells in a direction of extent of the solar cell string. A cell connector covering region, in which the cell connector on the front side of the solar cell in particular covers an electrode arranged on the front side of the solar cell, therefore preferably has a width of less than 1000 µm, in particular less than 500 µm, preferably less than 300 µm. This width therefore extends perpendicularly to that edge of the solar cell at which the cell connector is arranged and parallel to the direction of extent of the solar cell string. The width of the contact region is preferably more than 100 µm, further preferably more than 200 µm, in particular more than 250 µm, in order to form a mechanically stable connection between the cell connector and the solar cell.

In addition, the method according to the invention makes it possible to cover the solar cell over a great length perpendicularly to the direction of extent of the solar cell, such that mechanically enduring contact and electrical contact with low contact resistance are formed.

Advantageously, the cell connector covering region, in which the cell connectors cover the front sides of the solar cell, has a length which is greater than 80%, preferably greater than 90%, in particular preferably greater than 95% of the side length of the solar cell and thus the width of the solar cell string. This length of the contacting region thus extends parallel to the edge at which the cell connector is arranged and perpendicularly to the direction of extent of the solar cell string.

The present invention is also achieved by a solar cell string according to the invention. The solar cell string has at least five solar cells, wherein each solar cell has an electrode on a front side and an electrode on the rear side, the solar cells are arranged and electrically connected in series in a row along a longitudinal extent of the solar cell string, wherein the electrode on the front side of a solar cell is electrically conductively connected to the electrode on the rear side of an adjacent solar cell by means of a cell connector. The cell connectors are in the form of pliant cell connectors and each cell connector has at least one, preferably exactly one fold with subregions of the cell connectors that lie one on top of another in parallel, wherein the opening in the fold extends perpendicularly to the longitudinal extent of the solar cell string and the opening side of the fold alternates along the longitudinal extent of the solar cell string.

In the case of this solar cell string according to the invention, adjacent solar cell pairs thus have alternating mutually facing openings in the fold of the cell connectors and mutually remote openings in the fold of the cell connectors. This advantageous configuration emerges from the method according to the invention by arranging the cell connectors on the solar cell stack and then unfolding the solar cell stack to form the solar cell string. In this respect, it is within the scope of the invention that the solar cell string according to the invention is formed with solar cells lying next to one another in a plane or with solar cells in a shingle arrangement.

A processing device according to the invention for a solar cell string makes it possible to carry out the method according to the invention in particularly straightforward and thus failsafe and cost-effective fashion. The processing device has a plurality of support surfaces for a plurality of solar cells, wherein the support surfaces are arranged parallel to one another in stepped fashion. As a result, the formation of a solar cell stack for providing the solar cell stack according to method step A is enabled in straightforward fashion.

The steps formed by the support surfaces thus preferably have a step height which approximately corresponds to the overall thickness of the solar cell, and preferably deviates from the overall thickness of the solar cell by less than 50%, in particular less than 30%. The width of the support surface is preferably less than the width of the solar cell placed onto the support surface, in particular preferably the width of the support surface of the contacting device corresponds to the solar cell surface area minus the contacting region.

This has the effect that, when the solar cells are placed onto the support surfaces, a solar cell stack with overlapping solar cells according to method step A of the method according to the invention can be formed.

It is therefore advantageous to use the processing device according to the invention to carry out the method according to the invention, in particular a preferred embodiment of the method, wherein, in method step A, each solar cell of the solar cell stack is placed onto a support surface of the processing device in a subregion and the solar cells have a greater width than the width of the support surfaces.

The solar cell string according to the invention is preferably produced by means of the method according to the invention, in particular a preferred embodiment of the method. The method according to the invention is preferably designed to form the solar cell string according to the invention, in particular a preferred embodiment of the solar cell string.

The present invention is not restricted to the production of solar cell strings having five solar cells. It is in particular within the scope of the invention for the solar cell stack to have within the range of five to twenty solar cells and for all solar cells of the solar cell stack to be electrically connected to one another, in particular in a series connection, by means of the first and the second group of cell connectors according to the method according to the invention, in particular an advantageous embodiment. In particular, the solar cell stack preferably has more than five, preferably more than eight, in particular preferably more than 10 solar cells.

BRIEF DESCRIPTION OF THE DRAWINGS

Further advantageous features and configurations are explained below on the basis of the figures and the exemplary embodiments, in which.

All the figures show schematic illustrations that are not true to scale. The same reference signs in the figures denote elements that are the same or have the same effect.

DETAILED DESCRIPTION OF THE PREFERRED EMBODIMENTS

Figure 1:
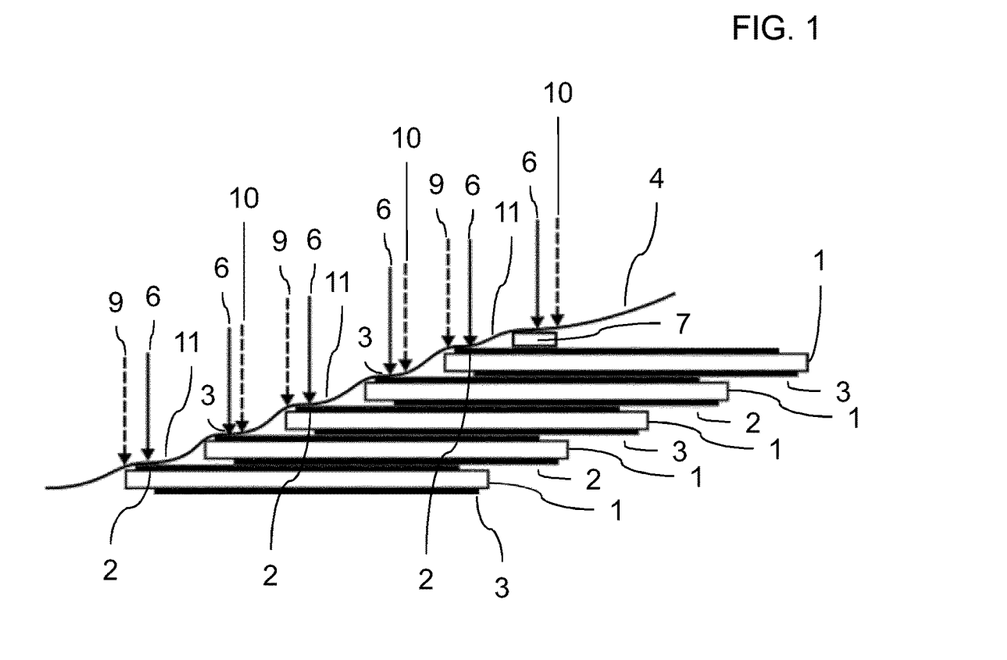
FIG. 1 and FIG. 2 show sub-steps of method step B of an exemplary embodiment of the method according to the invention.
Figure 2:
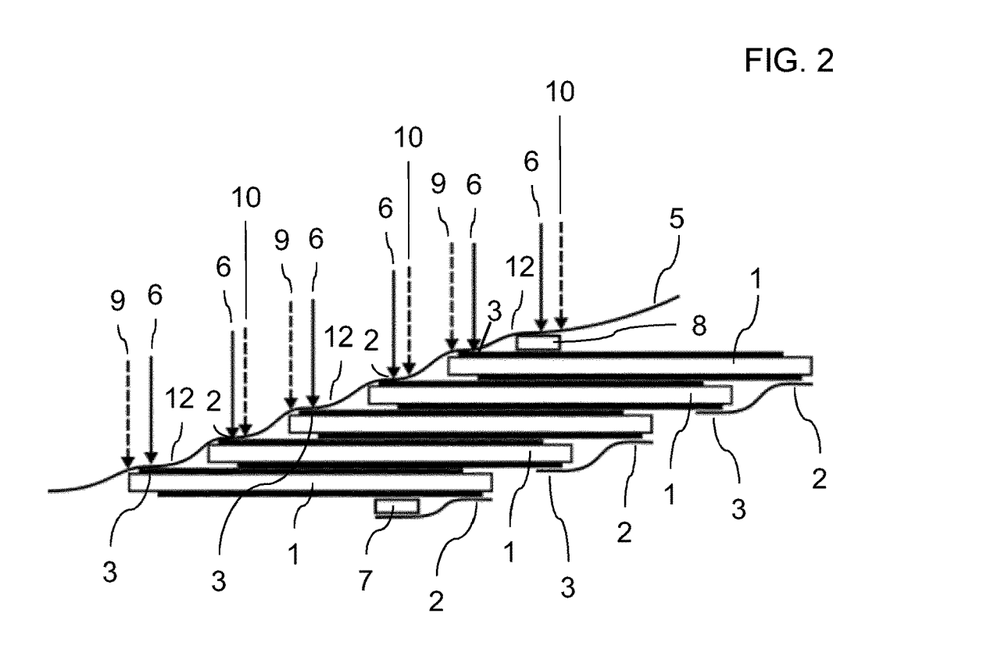

FIGS. 1 and 2 illustrate sub-steps of a method step B of an exemplary embodiment of a method according to the invention.

In the illustration according to FIG. 1, a method step A, in which a solar cell stack having, in the present case, five solar cells 1 was provided, has already been carried out. The solar cells 1 each have a front side and a rear side, wherein the solar cells are arranged in overlapping fashion, such that for each solar cell a marginal contacting region 2 on the front side and a marginal contacting region 3 on the rear side are not covered by an adjacent solar cell.

As can be seen in FIG. 1, the solar cells 1 are therefore arranged parallel to one another in the solar cell stack and form steps owing to the merely partial overlaps.

In method step B, an electrically conductive first connecting element 4 in the form of a metal foil is arranged.

The first connecting element 4 approximately follows the stepped shape on a first side, on the left in FIG. 1, of the solar cell stack and laser beams, illustrated by solid arrows 6 in FIG. 1, are used to form electrically conductive connections of the first connecting element 4 on the first side of the solar cell stack to the contacting regions 2, 3 of the solar cells 1 on the first side of the solar cell stack by way of the action of heat generated by the laser beams 6.

As can be seen in FIG. 1, in method step A, in addition a first end connector 7 was arranged on the uppermost solar cell 1 of the solar cell stack. In this respect, the first end connector 7 is spaced apart from that edge of the uppermost solar cell 1 that is on the left in FIG. 1, such that the stepped shape is continued by the first end connector 7. In method step B, the first connecting element 4 is likewise arranged on the first end connector 7 in that a laser beam 6 is used to form an electrically conductive connection between the first end connector 7 and the first connecting element 4 by way of the action of heat.

In a further sub-step of method step B, first laser beams 9 are used to separate the first connecting element 4, in order to divide the first connecting element 4 into a first group of cell connectors 11. The first laser beams 9 for separating the first connecting element 4 are illustrated as dashed lines.

By virtue of his division of the first connecting element 4 and the cell connectors 11 produced as a result, pairs of adjacent solar cells 1 are electrically conductively connected to one another on the first side of the solar cell stack. In the present case, this is a first pair which exists from the lowermost solar cell to the first and the second solar cell, and a second pair consisting of the third and the fourth solar cell. In addition, the uppermost, fifth solar cell is electrically conductively connected to the first end connector 7 by a cell connector 11 of the first group.

The first laser beams 9 for separating the first connecting element 4 are sufficient to form the first group of cell connectors. However, excess material of the first connecting element 4 remains behind. Therefore, second laser beams 10 for separation are used to sever excess material of the first connecting element 4.

Then, the solar cell stack is turned over, with a rotation by 180° about an axis perpendicular to the plane of the drawing in FIG. 1 taking place.

The resulting configuration is illustrated in FIG. 2, wherein, in a further sub-step of method step B, a second connecting element 5, which is likewise in the form of a metal foil, is arranged on the solar cell stack on a second side. The second side of the solar cell stack is opposite the first side, and as a result of the rotation described above, in FIG. 2 the second side of the solar cell stack is arranged on the left, whereas in FIG. 1 the first side of the solar cell stack is arranged on the left.

As already described in relation to the first connecting element 4, it is also the case for the second connecting element that the electrically conductive connection is formed between the second connecting element and the solar cells 1 by means of laser beams 6 and the action of heat generated by them. Similarly, after the solar cell stack is turned over, a second end connector 8 was arranged on the solar cell 1 which is uppermost after the solar cell stack is turned over. The second end connector 8 is likewise electrically conductively connected to the second connecting element 5 by means of a laser beam 6.

Similarly, first laser beams 9 are used to separate the second connecting element 5, such that cell connectors 12 of a second group of cell connectors are formed by dividing the second connecting element 5.

By virtue of the cell connectors 12 of the second group of cell connectors, pairs of adjacent solar cells 1 are thus likewise electrically conductively connected to one another on the second side (on the left in FIG. 2) of the solar cell stack. In the present case, according to the illustration in FIG. 2, this is a pair consisting of the lowermost first solar cell and, from there, the adjacent second solar cell, and a pair consisting of the third and fourth solar cell, with numbering starting from the bottom. Similarly, the uppermost solar cell 1 is by a cell connector 12. The second group of cell connectors is electrically conductively connected to the second end connector 8.

It is also the case for the second connecting element that second laser beams 10 are used to perform separating steps in order to remove excess material of the second connecting element 5. In the illustration according to FIG. 2, in the case of the first connecting element 4 the excess material is already removed, and therefore only the cell connectors 11 of the first group of cell connectors remain.

Owing to the arrangement of the solar cells 1 in the solar cell stack with alternatingly arranged front sides and rear sides, each front side of a solar cell is electrically conductively connected to the rear side of a solar cell above or below it by each cell connector 11 of the first group and also by the cell connectors 12 of the second group.

The solar cells have identical designs and each have a metallic front-side electrode, not illustrated, on the front side in the contacting region and also likewise a metallic contacting electrode on the rear side in the contacting region. The cell connectors 11 of the first group and cell connectors 12 of the second group are each electrically conductively connected to the electrodes described above on the solar cells.

In the case of the present solar cells, the electrodes on the front side are in the form of n-type electrodes and electrodes on the rear side are in the form of p-type electrodes, resulting in the production of an electrical series connection of the solar cells.

Rotational movements of the solar cells now cause the solar cell stack to unfold, such that the solar cells are arranged in a solar cell string and thus extend along a longitudinal extent of the solar cell string. This is illustrated in FIG. 3:

FIG. 3a) shows a side view of the solar cell string, which is produced after unfolding the solar cell stack illustrated in FIG. 2 and after implementing the electrically conductive connection and carrying out separating steps by means of the laser beams 6, 9 and 10.

Figure 3:
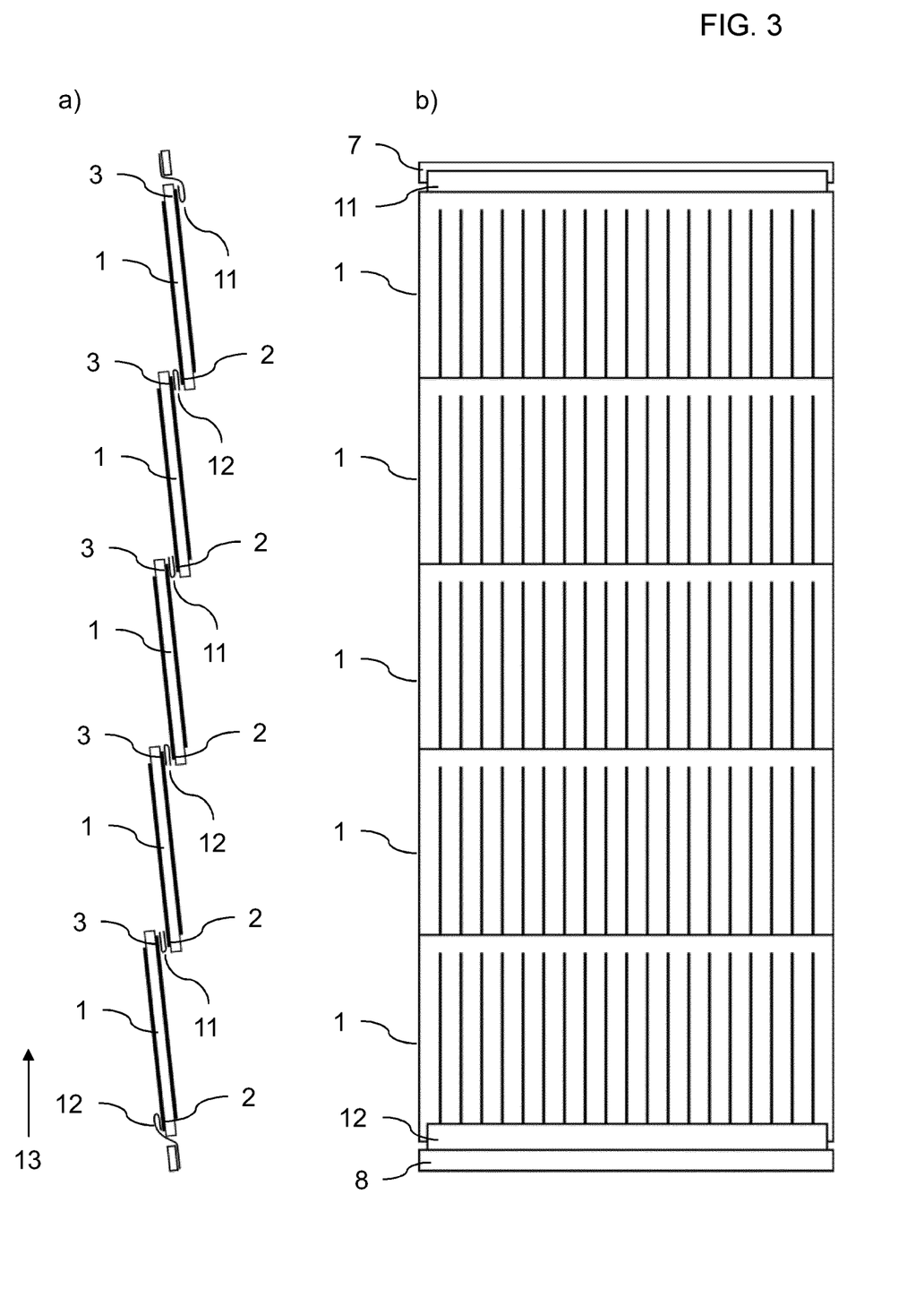
FIG. 3 shows a side view and a plan view from above of a first exemplary embodiment of a solar cell string according to the invention.

In the case of this first exemplary embodiment of a solar cell string according to the invention that is illustrated in FIG. 3, the lengths of the cell connectors 11 of the first group and of the cell connectors 12 of the second group are selected such that a shingle arrangement is produced. As can be seen in FIG. 3a), each solar cell covers the adjacent solar cell on the right-hand side in the contacting region and is covered by the adjacent solar cell on the left-hand side in the contacting region, resulting in the production of a shingle arrangement which is known per se. The marginal solar cells are each electrically conductively connected to the end connectors 7 and 8 described above at the external edges.

For clarification purposes, a direction of extent 13 of the solar cell string is illustrated by an arrow. The solar cells 1 are arranged in a row along the direction of extent 13.

The cell connectors 11 of the first group and cell connectors 12 of the second group each have a fold with subregions of the cell connector that lie one on top of another in parallel, wherein the opening in the fold extends perpendicularly to the longitudinal extent 13 of the solar cell string and the opening side of the fold alternates along the longitudinal extent of the solar cell string. As can be seen in FIG. 3a), starting from the left-hand solar cell, the fold of the cell connector between the first and the second solar cell is open to the right, whereas the fold of the cell connector between the second and the third solar cell is open to the left. The side of the opening in the fold thus changes alternately between left and right along the longitudinal extent 13 of the solar cell string.

FIG. 3b) shows a plan view from above of the solar cell string. Here, it can be seen that, on the front side, the solar cells 1 have contacting structures, what are referred to as contacting fingers, which are known per se, extend in parallel and are illustrated by black lines.

Owing to the shingle arrangement, the cell connectors between the solar cells are each concealed by a solar cell owing to the overlapping arrangement in the plan view from above.

Figure 4:
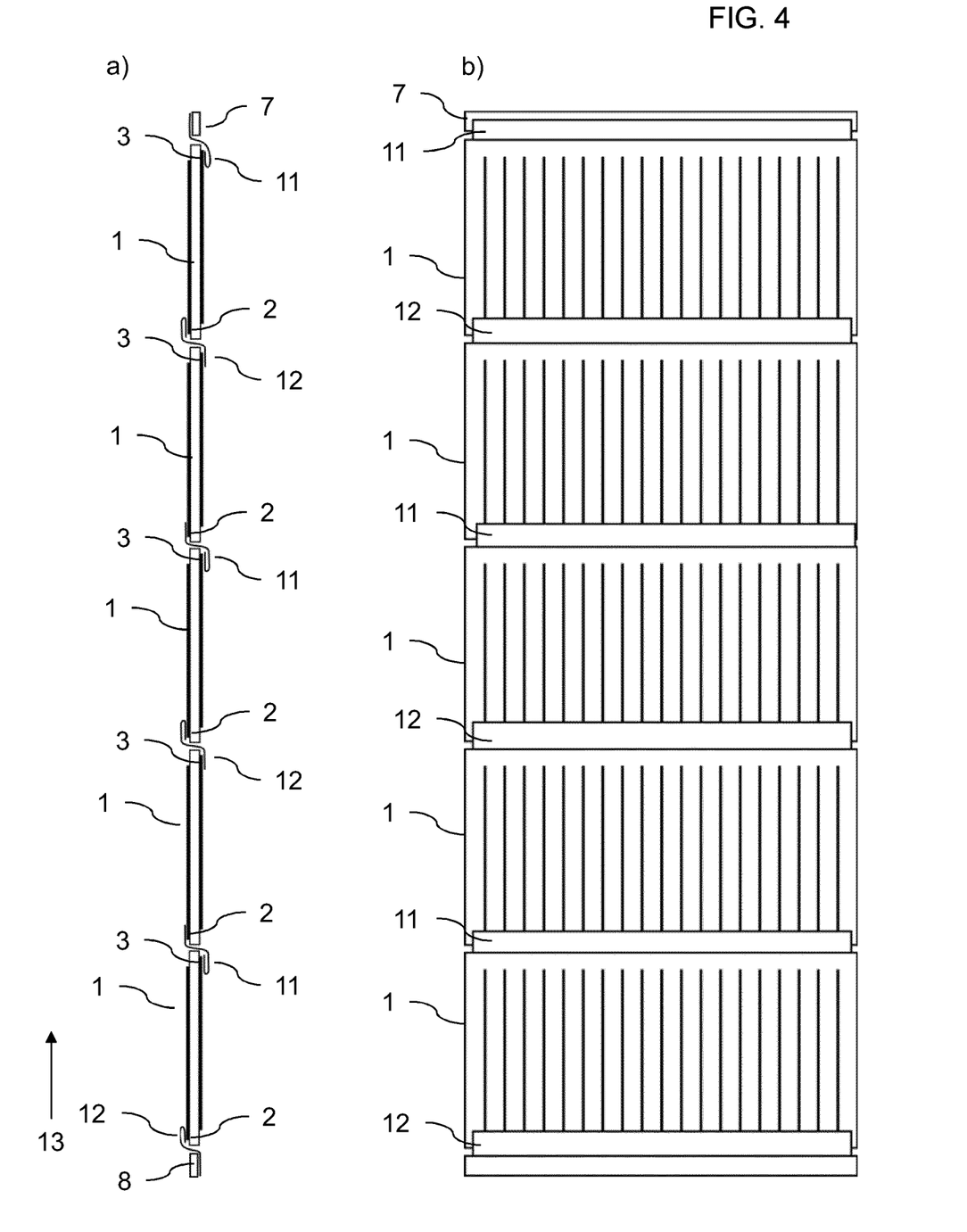
FIG. 4 shows a side view and a plan view from above of a second exemplary embodiment of a solar cell string according to the invention.

FIG. 4 shows a second exemplary embodiment of a solar cell string according to the invention. To avoid repetitions, only the essential differences in relation to the first exemplary embodiment shown in FIG. 3 are discussed below.

The solar cell string illustrated in FIG. 4 has also been produced by method steps as described in relation to FIG. 1 and FIG. 2. By contrast to the exemplary embodiments shown in FIG. 3, the cell connectors 11 of the first group and the cell connectors 12 of the second group have a greater length, and therefore a non-overlapping arrangement of the solar cells 1 next to one another, such that the solar cells form a plane in the direction of extent 13 of the solar cell string, is enabled.

The cell connectors 11 of the first group and cell connectors 12 of the second group of cell connectors thus extend from the contacting region on the front side of a solar cell 11 between two adjacent solar cells through to the contacting region of the rear side of the adjacent solar cell. The solar cells 1 are designed identically to the solar cells 1 according to the first exemplary embodiment described in FIG. 3 and likewise have electrodes on the front and the rear side, the electrodes being electrically conductively connected to the cell connectors such that an electrical series connection is also formed in the case of this solar cell string.

As can be seen in FIG. 4a), it is also the case in this arrangement that each cell connector has a fold and it is also the case in this arrangement that the opening direction of the fold of the cell connectors alternates in the direction of extent 13 of the solar cell string.

FIG. 4b) shows a plan view from above of the solar cell string according to the second exemplary embodiment. Since there is no shingle arrangement here, the cell connectors are partially visible in the plan view from above.

Figure 5:
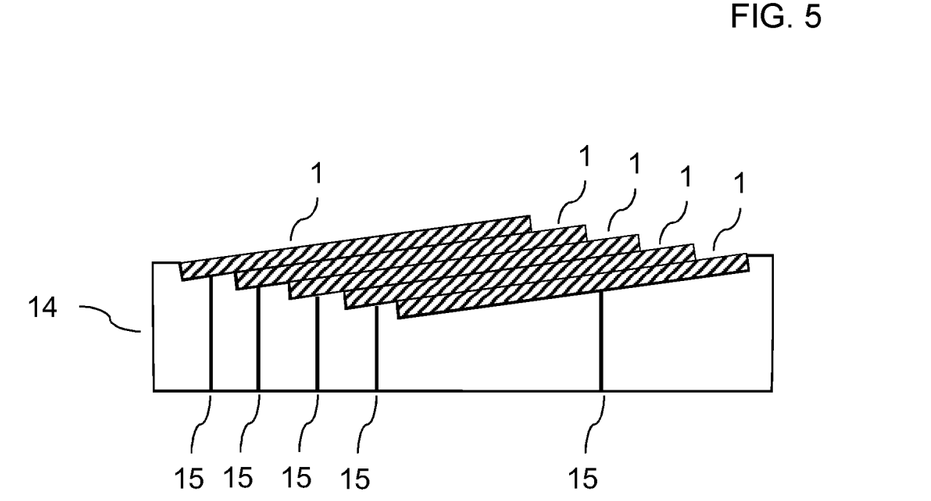
FIG. 5 shows a sectional drawing of an exemplary embodiment of a processing device according to the invention.

FIG. 5 shows an exemplary embodiment of a processing device 14 according to the invention. The processing device has a plurality of stepped support surfaces, on which in the present case five solar cells 1 are placed. The support surfaces are arranged parallel to one another in stepped fashion, such that the solar cells are arranged one on top of another in parallel in a stack, wherein for each solar cell a marginal contacting region on the front side and a marginal contacting region on the rear side of the solar cell 1 are not covered by an adjacent solar cell 1.

The processing device 14 has multiple bores 15 in order to generate a negative pressure by means of a pump, such that the solar cells 1 are arranged stably on the processing device 14 by means of negative pressure.

Figure 6:
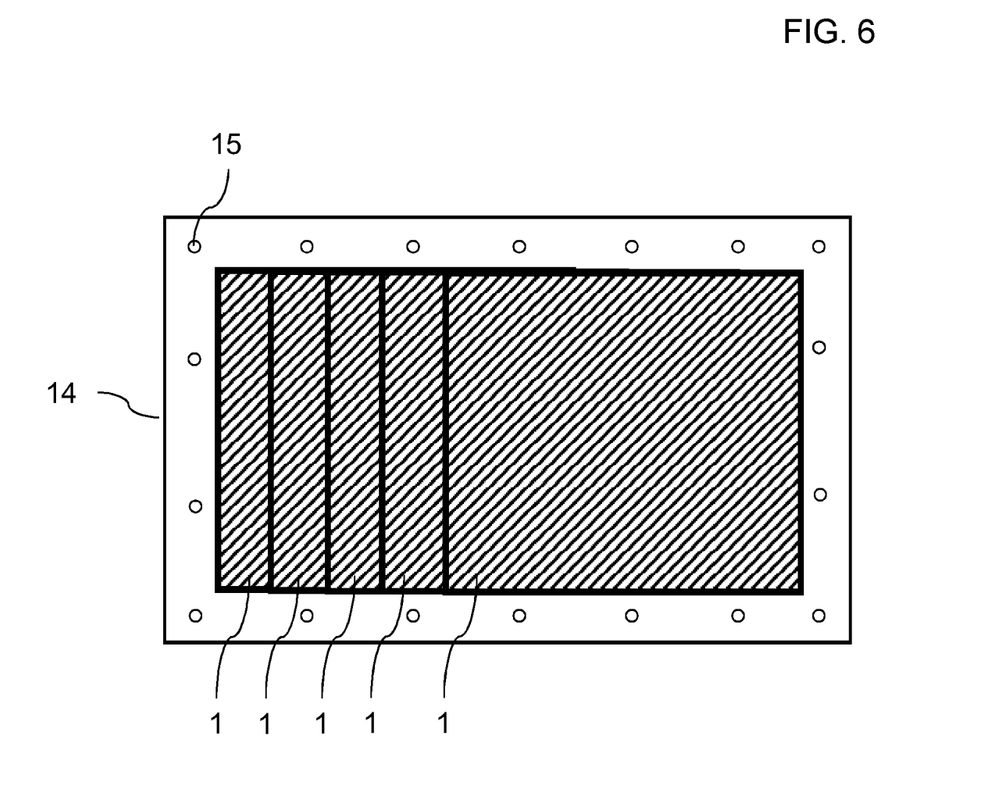
FIG. 6 shows a plan view from above of the processing device shown in FIG. 5.

FIG. 6 shows a plan view from above of the processing device shown in FIG. 5. As can be seen in FIG. 6, multiple bores 15 illustrated by circles are arranged all around the periphery of the support surface for the solar cells 1 in a perimeter of the processing device 14. By way of example, the bore in the top left corner is characterized by the reference sign 15. When the electrically conductive connecting element in the form of a metal foil is being arranged, the metal foil in the illustration according to FIG. 5 is placed onto the solar cell stack from above, such that this metal foil completely covers the solar cells and also covers that edge of the processing device 14 that runs all around the periphery and is illustrated in FIG. 6, such that the metal foil for forming the cell connectors can also be pressed against the processing device 14 and against the solar cells 1 by means of the bores 15 illustrated as circles by generating a negative pressure using a pump.

Then, the electrically conductive connection is formed and the connecting element, that is to say in the present case the metal foil, is severed, as described above.

LIST OF REFERENCE SIGNS

1 Solar cells
2 Contacting region on the front side
3 Contacting region on the rear side
4 First connecting element
5 Second connecting element
6 Laser beams for electrically conductive connection
7 First end connector
8 Second end connector
9 First laser beams for separation
10 Second laser beams for separation
11 Cell connector of the first group of cell connectors
12 Cell connector of the second group of cell connectors
13 Direction of extent 14 Processing device
15 Bore

The invention claimed is:

1. A method for producing a solar cell string, the method comprising:
   providing a solar cell stack having at least five solar cells (1), which each have a front side and a rear side, wherein the solar cells (1) are arranged in overlapping fashion, such that for each solar cell (1) a marginal contacting region on the front side (2) of the solar cell (1) and a marginal contacting region on the rear side (3) of the solar cell (1) are not covered by an adjacent solar cell (1),
   forming electrically conductive connections between the solar cells (1) by:
      arranging an electrically conductive first connecting element (4) on the solar cell stack and forming electrically conductive connections, such that the first connecting element (4) is electrically conductively connected on a first side of the solar cell stack to the contacting regions of the solar cells (1) on the first side;
      dividing the first connecting element (4) into a first group of cell connectors (11), such that pairs of adjacent solar cells (1) are electrically conductively connected to one another on the first side of the solar cell stack by the cell connectors (11) of the first group;
      arranging an electrically conductive second connecting element (5) on the solar cell stack and forming electrically conductive connections, such that the second connecting element (5) is electrically conductively connected on a second side of the solar cell stack to the contacting regions of the solar cells on the second side;
      dividing the second connecting element (5) into a second group of cell connectors (12), such that pairs of adjacent solar cells (1) are electrically conductively connected to one another on the second side of the solar cell stack by the cell connectors (12) of the second group.

2. The method as claimed in claim 1, wherein, in providing the solar cell stack, the solar cells (1) are arranged in the stack with mutually facing front sides or with mutually facing rear sides, with alternating mutually facing front sides and mutually facing rear sides.

3. The method as claimed in claim 1, wherein, in forming the electrically conductive connections, the solar cell stack is turned over between arranging the first connecting element (4) and arranging the second connecting element (5).

4. The method as claimed in claim 1, wherein, in forming the electrically conductive connections, in addition to dividing the first and the second connecting element (4, 5), excess material of the first and the second connecting element (4, 5) is removed, by severing the excess material by means of laser radiation.

5. The method as claimed in claim 1, wherein, after forming the electrically conductive connections, a solar cell string arrangement having solar cells (1) in a shingle arrangement is formed from the stack arrangement by rotational movements of the solar cells (1).

6. The method as claimed in claim 1, wherein in forming the electrically conductive connections, the electrically conductive connections of the first and the second connecting element (4, 5) to the solar cells (1) are formed by means of laser radiation (6).

7. The method as claimed in claim 1, wherein in forming the electrically conductive connections, the first and the second connecting element (4, 5) are divided by means of laser radiation (9, 10).

8. The method as claimed in claim 1, wherein in providing the solar cell stack, a respective end connector (7, 8) is arranged and electrically conductively connected to the external solar cell (1) at least on the external sides of the two terminal solar cells (1) of the solar cell stack.

9. The method as claimed in claim 1, wherein the first and the second connecting element (4, 5) are in the form of a pliant connecting element, in the form of a metal foil.

10. The method as claimed in claim 1, wherein each solar cell (1) has an electrically conductive electrode on the front side and on the rear side at least in the contacting region (2, 3) and, in forming the electrically conductive connections, the first and the second connecting element (4, 5) are electrically conductively connected to the electrodes of the solar cells (1).

11. The method as claimed in claim 1, wherein, in forming the electrically conductive connections, the solar cells (1) are electrically connected in series by means of the first and the second group of cell connectors (11, 12).

12. The method as claimed in claim 1, wherein, after forming the electrically conductive connections, a solar cell string arrangement having solar cells (1) lying next to one another is formed from the stack arrangement by rotational movements of the solar cells (1).

* * * * *